United States Patent
Foti (10) Patent No.: US 10,658,727 B1
(45) Date of Patent: May 19, 2020

(54) COMBINER/DIVIDER HAVING TAPERED WAVEGUIDES STACKED IN THEIR E-PLANES

(71) Applicant: Werlatone, Inc., Brewster, NY (US)

(72) Inventor: Stephen Joseph Foti, Weston-super-Mare (GB)

(73) Assignee: Werlatone, Inc., Patterson, NY (US)

( * ) Notice: Subject to any disclaimer, the term of this patent is extended or adjusted under 35 U.S.C. 154(b) by 0 days.

(21) Appl. No.: 16/398,129

(22) Filed: Apr. 29, 2019

(51) Int. Cl.
    *H01P 5/18*      (2006.01)
    *H03H 7/42*      (2006.01)

(52) U.S. Cl.
    CPC ............... *H01P 5/183* (2013.01); *H03H 7/42* (2013.01)

(58) Field of Classification Search
    CPC .................................. H01P 5/183; H03H 7/42
    See application file for complete search history.

(56) References Cited

U.S. PATENT DOCUMENTS

| | | | |
|---|---|---|---|
| 3,218,580 A * | 11/1965 | Zanichkowsky | ......... H01P 5/12 333/125 |
| 4,583,061 A | 4/1986 | O'Shea | |
| 4,590,446 A | 5/1986 | Hsu et al. | |
| 4,599,584 A | 7/1986 | Sasser et al. | |
| 4,673,899 A | 6/1987 | Jespersen et al. | |
| 2005/0174194 A1 | 8/2005 | Wu et al. | |

OTHER PUBLICATIONS

Secmen, M., et al., E-plane Sectoral Horn Power Divider, The Institution of Engineering and Technology, vol. 4, Iss. 2, 2010, pp. 191-199, 9 pages.
Ning, Yuemin, et al., A New Spatial Power Combiner Based on 32-way Ridged Waveguides, Science and Technolog on Electronic Test & Measurement Laboratory, IEEE, 2014, 4 pages.
Abed, Amer Tawfeeq, Study of Radiation Properties in Taylor Distribution Uniform Spaced Backfire Antenna Arrays, American Journal of Electromagnetics and Applications, vol. 2, Nov. 3, 2014, pp. 23-26, 4 pages.
Nikolova, Lecture 18: Horn Antennas, McMaster University, Department of Electrical & Computer Engineering, Dec. 13, 2016, 29 pages.

* cited by examiner

*Primary Examiner* — Robert J Pascal
*Assistant Examiner* — Kimberly E Glenn
(74) *Attorney, Agent, or Firm* — Kolisch Hartwell, P.C.

(57) ABSTRACT

A combiner/divider includes a transition waveguide interposed between a plurality of input/output waveguides and an output/input waveguide. The input/output waveguides are preferably distributed in a radial sector extending in the E-plane of the input/output waveguides. The input/output waveguides extend from inner nodes disposed proximate to and spaced from a sector center to outer nodes disposed along an arc of the sector. At least some of the input/output waveguides taper in size from the inner nodes to the outer nodes. Walls between adjacent input/output waveguides also may taper in width between the inner nodes and the outer nodes. The output/input waveguide has an inner port facing and spaced from the inner nodes of the input/output waveguides. A transition waveguide extends between the input/output waveguides and the output/input waveguide and has side walls extending along the radii of the sector for commmunicatively coupling the output/input waveguide with input/output waveguides.

13 Claims, 9 Drawing Sheets

COMBINER/DIVIDER HAVING TAPERED WAVEGUIDES STACKED IN THEIR E-PLANES

FIELD

The present disclosure relates generally to power combiners/dividers in radio frequency (RF) devices, and specifically to N-Way waveguide or coaxial power combiners/dividers.

BACKGROUND

When it is desirable to combine many high-power input signals to achieve an extremely high-power output signal with very low-loss, 360-degree radial waveguide power combiners are typically employed. Such radial waveguide power combiners may typically incorporate waveguide or coaxial input port geometries. The input signals are then combined in the center of the radial waveguide by a transition from radial waveguide to a transverse electro-magnetic (TEM) mode coaxial transmission line. The coaxial transmission line is utilized because of its circular symmetry to achieve a high degree of amplitude and phase balance of the input signals for efficient combining. The coaxial transmission line must operate in its lowest order (TEM) mode in order to maintain amplitude and phase balance. This necessitates the cross-sectional dimensions of the coaxial transmission line to be below a threshold which depends upon the operating frequency range in order to render any undesirable higher order modes evanescent by decaying sufficiently to avoid perturbing the amplitude and phase balance. Invoking this cross-sectional dimension constraint on the coaxial transmission line limits both the peak and average power levels that can be achieved without component failure.

SUMMARY

In some embodiments, a combiner/divider may include a first plurality of input/output waveguides stacked in their E-Planes and diverging in at least a partially common direction away from a central point. In this example, each input/output waveguide extends between an outer node disposed distal of the central point and an inner node proximate to and spaced from the central point. Each of at least a second plurality of the first plurality of the input/output waveguides have a respective dimension in the plane that varies along a length of the input/output waveguides between the inner node and the outer node. An output/input waveguide has an inner port proximate to the central point and facing the inner nodes of the first plurality of input/output waveguides. A transition waveguide defines an open cavity between the inner port and the inner nodes of the first plurality of input/output waveguides. The transition waveguide flares outwardly in the plane from the inner port of the output/input waveguide toward the inner nodes of the first plurality of input/output waveguides. The transition waveguide communicatively couples the output/input waveguide with the first plurality of input/output waveguides.

In some embodiments, a combiner/divider includes a plurality of input/output waveguides distributed in a sector having outer radii extending at an angle from a center. The sector extends in the E-Planes of the plurality of input/output waveguides, the E-Planes being parallel to electric field vectors of the plurality of input/output waveguides. The plurality of input/output waveguides extend radially along radii extending in the sector from the center. The plurality of input/output waveguides extend from inner nodes disposed proximate to and spaced from the center to outer nodes disposed along an arc of the sector. Each of the plurality of input/output waveguides has a respective dimension in the plane that increases linearly from the inner node to the outer node. The plurality of input/output waveguides have transverse walls that are transverse to the plane. The transverse walls extend from the inner nodes to the outer nodes along radii from the center of the sector. Adjacent transverse walls of adjacent input/output waveguides have respective adjacent waveguide wall faces that are separated by a distance that increases linearly between the inner nodes and the outer nodes. An output/input waveguide has an inner port facing and spaced from the inner nodes of the plurality of input/output waveguides. A transition waveguide defines an open cavity between the inner port of the output/input waveguide and the inner nodes of the plurality of input/output waveguides. The transition waveguide has side walls spaced apart in the plane that extend along the outer radii of the sector and flare outwardly in the plane from the inner port of the output/input waveguide to the inner nodes of the plurality of input/output waveguides. The transition waveguide communicatively couples the output/input waveguide with the plurality of input/output waveguides.

Features, functions, and advantages may be achieved independently in various embodiments of the present disclosure, or may be combined in yet other embodiments, further details of which can be seen with reference to the following description and drawings.

BRIEF DESCRIPTION OF THE DRAWINGS

Additional aspects of combiners/dividers will become evident upon reviewing the non-limiting embodiments described in the description and the claims taken in conjunction with the accompanying figures, in which:

DESCRIPTION

Overview

Various embodiments of a combiner/divider coupling a plurality of input/output waveguides to an output/input waveguide are described below and illustrated in the associated drawings. Unless otherwise specified, a combiner/divider and/or its various components may, but is not required to, contain at least one of the structure, components, functionality, and/or variations described, illustrated, and/or incorporated herein. Furthermore, the structures, components, functionalities, and/or variations described, illustrated, and/or incorporated herein may, but are not required to, be included in other combiners and/or dividers. The following description of various embodiments is merely exemplary in nature and is in no way intended to limit its scope, applications, or uses. Additionally, the advantages provided by the embodiments, as described below, are illustrative in nature and not all embodiments provide the same advantages or the same degree of advantages.

Generally, a combiner/divider as disclosed herein includes a transition waveguide interposed between a plurality of input/output waveguides and an output/input waveguide. In applications where the input/output waveguides are the same and are distributed in a radial sector extending in the E-plane of the input/output waveguides, equal amplitude and phase signals are propagated in the input/output waveguides. It will be appreciated that other configurations may be realized for other applications for providing the same or different signal amplitudes and phases. The input/output waveguides extend from inner nodes disposed proximate to and spaced from a sector center to outer nodes disposed along an arc of the sector. Again, depending on the application, at least some of the input/output waveguides taper in size between the inner nodes and the outer nodes. Walls between adjacent input/output waveguides also may taper in width between the inner nodes and the outer nodes. It will be appreciated that the rate of taper of the waveguides and/or walls as well as sizes of the waveguides at the inner and outer nodes affect the overall size of the combiner/divider. In general, the output/input waveguide has an inner port facing and spaced from the inner nodes of the input/output waveguides. A transition waveguide extends between the input/output waveguides and the output/input waveguide and has side walls extending along the radii of the sector for communicatively coupling the output/input waveguide with the input/output waveguides.

Definitions

The structures disclosed herein may be used as either combiners or dividers. The general term "combiner/divider" identifies both functions, with the applicable function depending on the use of the structure. When used as a combiner, then input/output waveguides function as input waveguides, and an output/input waveguide functions as an output waveguide. Correspondingly, when used as a divider, the output/input waveguide functions as an input waveguide and the input/output waveguides function as output waveguides.

"Sector" refers to a geometrical figure bounded by two equal-length outer radii extending from a common center and an included arc of a circle connecting outer ends of the outer radii.

"Node" refers to a point on an electrical circuit where a characteristic of the circuit may be identified. A port or a terminal is considered a node of a circuit structure that provides external access or represents an end of a circuit component or structure, such as a waveguide.

EXAMPLES, COMPONENTS, AND ALTERNATIVES

The following sections describe selected aspects of exemplary combiner/dividers. The examples in these sections are intended for illustration and should not be interpreted as limiting the entire scope of the underlying concepts. Each section may include one or more distinct inventions, and/or contextual or related information, function, and/or structure.

Example 1

Figure 1:
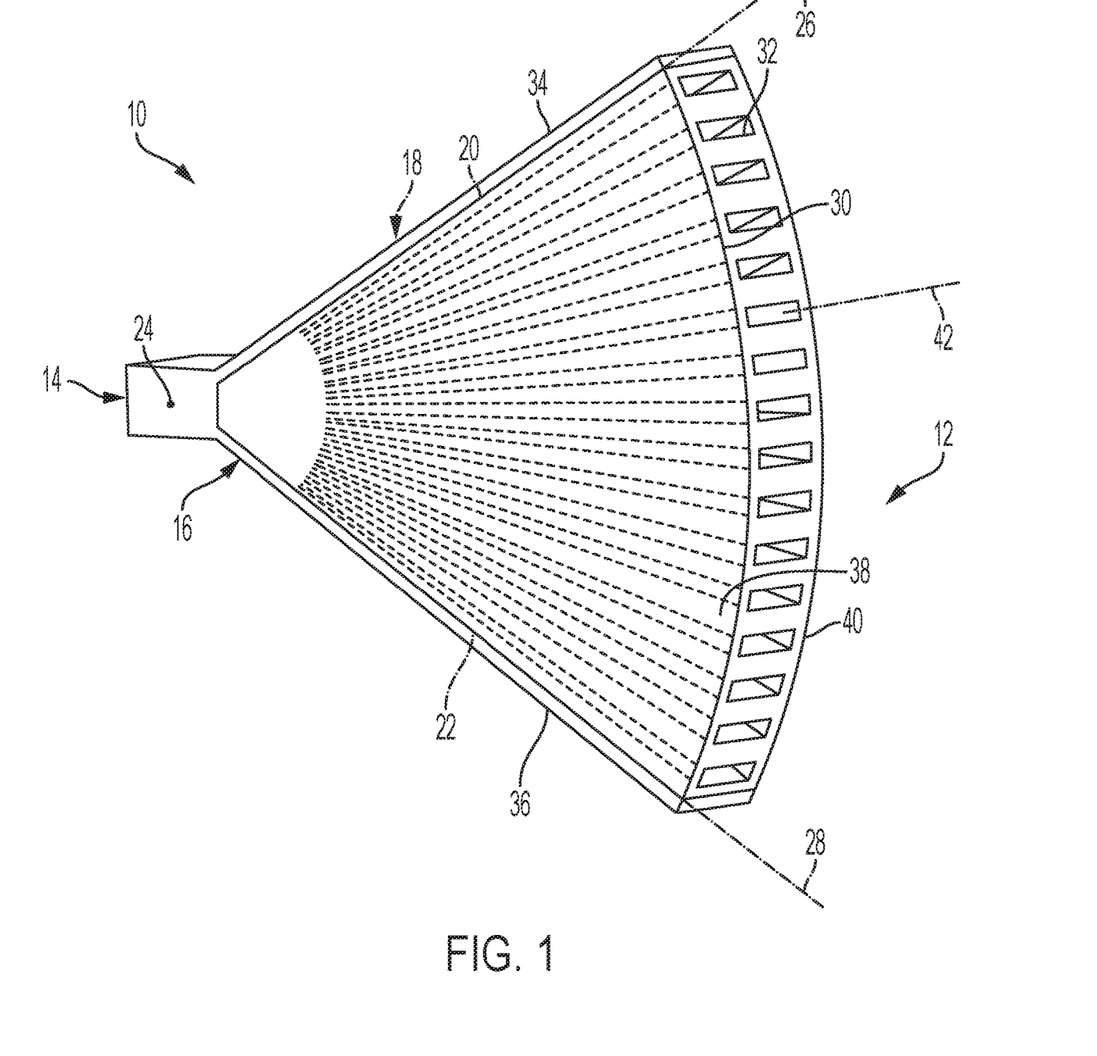
FIG. 1 is an isometric view of an example of a 16-Way combiner/divider having 16 tapered input/output waveguides stacked in their E-Planes within a radial sector structure.
Figure 2:
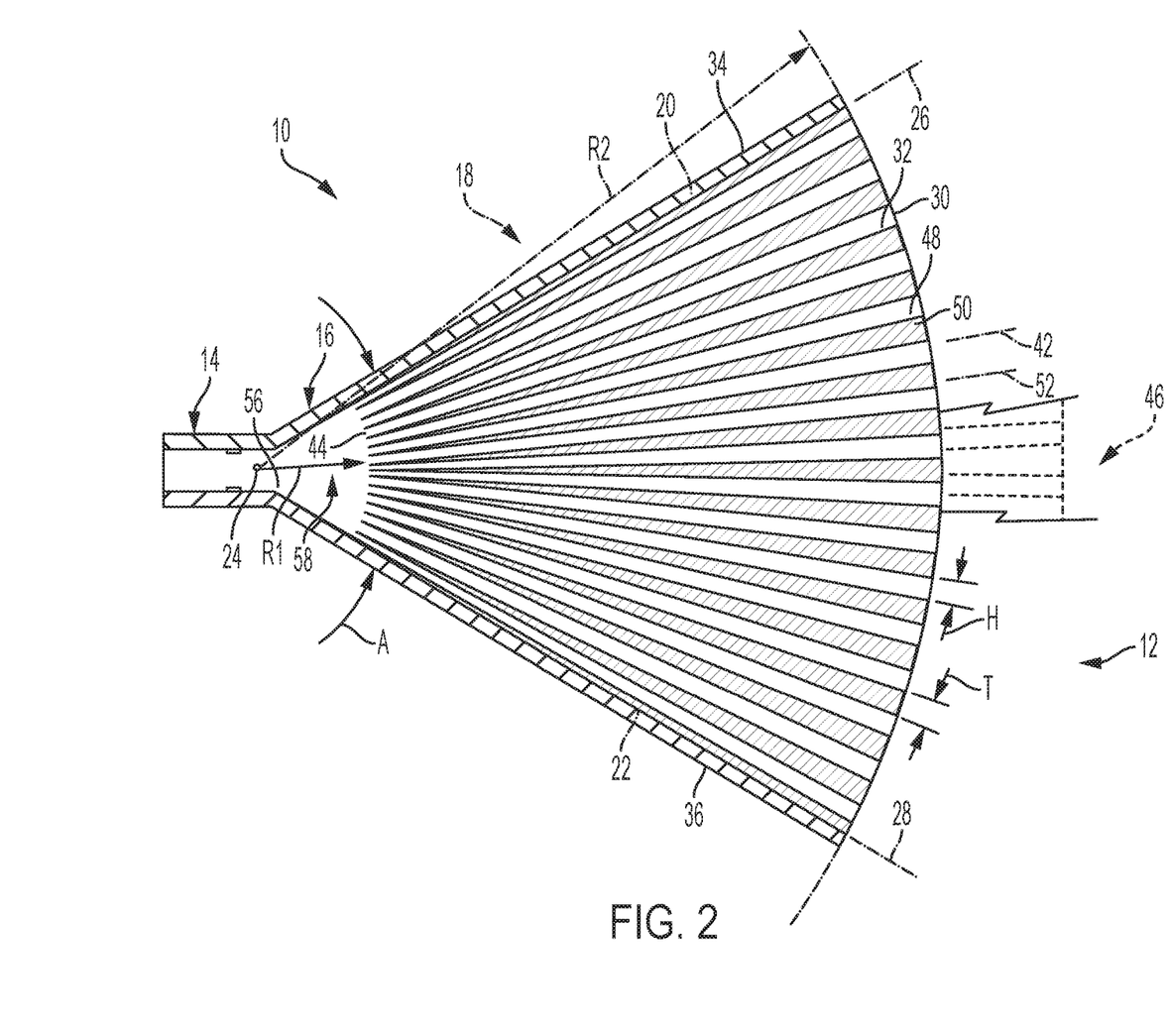
FIG. 2 is a cross-section of the combiner/divider of FIG. 1 taken along a plane containing the 16 input/output waveguides.
Figure 3:
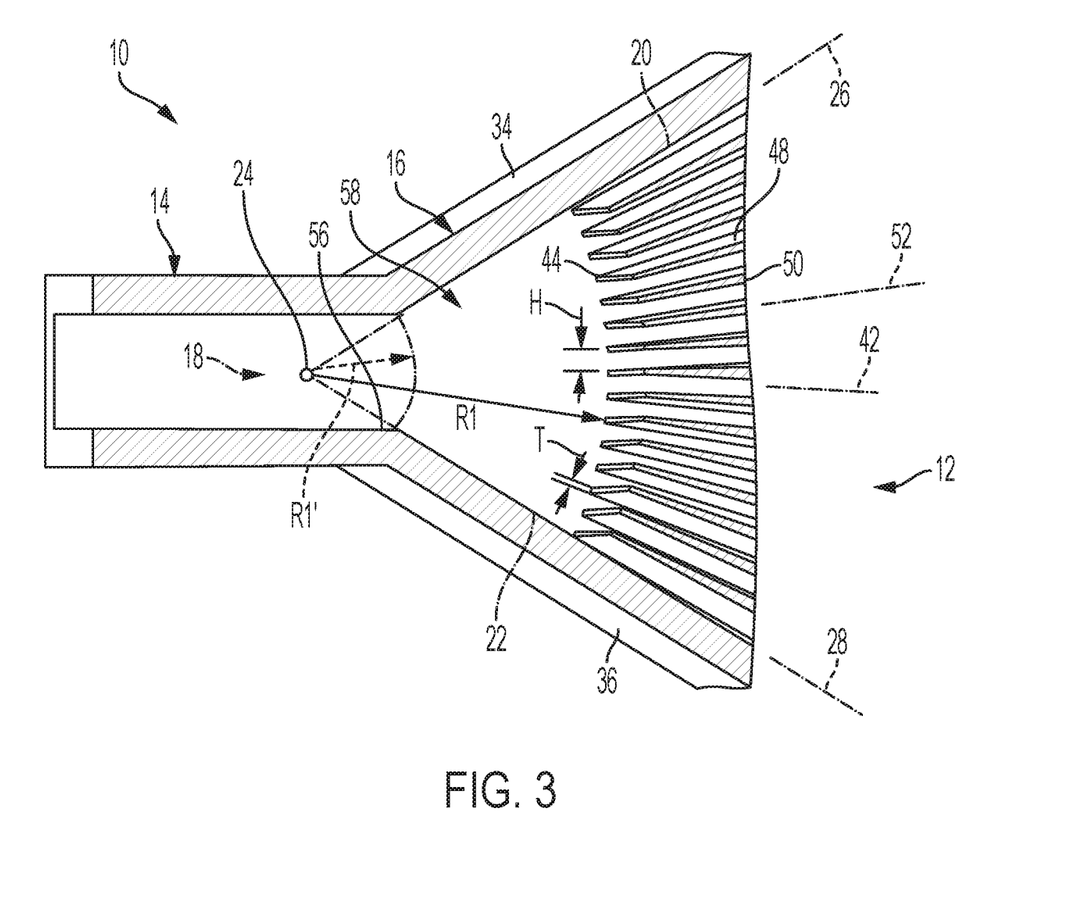
FIG. 3 is an enlarged isometric view of a portion of the combiner/divider in cross section as shown in FIG. 2 showing details of an output/input waveguide, transition waveguide, and truncated inner ends of the input/output waveguides.

Referring initially to FIGS. 1-3, a combiner/divider is disclosed that can be used to guide high power signals at low loss. As a combiner it is configured to efficiently combine a plurality of input signals directly to an input port of an output waveguide. The resultant power combiner's output power level capability can approach that of the output waveguide. This is typically orders of magnitude greater than the maximum power that could be achieved in designs that incorporate coaxial transmission line sections such as radial waveguide power combiners. For example, for the rectangular waveguide WR159 recommended waveguide frequency band of 4.9-7.05 GHz, the peak power handling is 2.79 Mw and the average power handling is 15 Kw using copper waveguide material. A plurality of input/output waveguides are stacked in their E-Planes within a radial sector and taper down in height from the input/output ports of the input/output waveguides toward the output/input waveguide where the signals from all the input/output waveguides are added to produce extremely high output power when operating in a combiner mode. This combiner design structure is more compact and lower-loss than other high-power waveguide combiner/divider designs which, for example, are comprised of a multiplicity of cascaded "Magic-T" 2-way waveguide combiner/dividers in a corporate arrangement.

In the example embodiment shown in FIGS. 1-3, an equal amplitude and phase 16-Way combiner/divider has sixteen waveguide input/output ports positioned on a circular arc within a radial sector of subtended angle A. Any practical number, N, of input/output waveguides can be employed and N can be any appropriate positive integer greater than or equal to 2, i.e. N does not have to be a power of 2. The input/output waveguides are spaced on a circular arc such that there is sufficient area around each input/output waveguide port for connection to the waveguide flange of an external input/output device, such as an amplifier. Alternatively, if coaxial inputs/outputs are preferred for a particular embodiment as shown in FIGS. 5-9, then end-launch coaxial-to-waveguide transitions may be employed and these can be connected to the areas around each input/output waveguide port. The central axes of the input waveguides are oriented such that they are normal to the circular arc of the radial sector. These input/output waveguide axes intersect at the center or origin of the radial sector near the location of the output/input waveguide.

When operating in the combiner mode, the input waveguides are tapered in their heights and continue to be reduced in their heights until they arrive close to the origin of the radial sector near the location of the output waveguide, i.e. in a cavity region at the inner ends of the input waveguides. The tapered input waveguides are at their minimum heights at their ends close to the origin of the radial sector where the top and bottom walls of the input waveguides are truncated. The input waveguides radiate into the cavity region between their truncated ends and the output waveguide. If all the input waveguides have input signals that are equal in amplitude and in-phase, then when these signals arrive at the truncated inner ends of the input waveguides the radiated electric fields from each of them constructively add and form a composite electric field distribution which closely matches the electric field distribution required in the output waveguide so that any reflections are low. Any small reflections can easily be compensated by the inclusion of small scattering objects (not shown in the figures), such as posts, known to those skilled in the art.

It should be noted that the top and bottom waveguide walls of the input/output waveguides are preferably tapered in their thicknesses to achieve a compact design and also to reduce the sizes of their truncated inner ends. This allows the E-fields of the truncated input waveguides to provide a more continuously uniform E-field distribution to closely match the preferred uniform e-field distribution of the output/input waveguide. However, for lower frequencies, the input/output waveguide walls may be constant in thickness preferably as long as the thickness is a very small portion of a wavelength.

Specifically, FIGS. 1-3 illustrate a combiner/divider 10 made of electrically conductive material, such as copper, and having a plurality of input/output waveguides 12. In this example, there are sixteen input/output waveguides 12, although any suitable number of waveguides may be used subject to manufacturing tolerances. Input/output waveguides 12 are communicatively coupled to an output/input waveguide 14 via a transitional waveguide 16.

Input/output waveguides 12 and transitional waveguide 16 are positioned in the configuration of a radial sector 18 defined by outer radii 20, 22, that extend from a center 24 along respective radial lines 26, 28, and an arc 30 extending between the outer radii at outer input/output waveguide nodes 32. In this example, outer nodes 32 are also distal input/output ports of input/output waveguides 12. The input/output waveguides are stacked in sector 18 in a plane corresponding to the plane of sector 18 and the plane of view of FIG. 2, which is in the E-planes of the input/output waveguides.

Arc 30 subtends an angle A of 60 degrees, although other angles may be used as appropriate for a given application and number of input/output waveguides. It is preferable that the input/output waveguides extending from a center 24 extend at least partially in a common direction. With combiner/divider 10, each of input/output waveguides 12 extend at least partially to the right as viewed in FIG. 2.

A subtended angle of 60 degrees is found to provide a good compromise between a very small subtended angle which would require a very long structure to accommodate the width of the input/output nodes 32 (either waveguides or coaxial connectors) and a larger subtended angle for which the input waves from the uppermost and lowermost input/output waveguides 12 would arrive at the aperture (inner port) of output/input waveguide 14 approaching a "sideways" incident condition (which would occur at the extreme value of 180 degree subtended angle). This could cause the coupling of end input/output waveguides 12 to output/input waveguide 14 to be weaker than the central ones and that would degrade amplitude balance. The advantage of large subtended angles is the reduction of the length of the combiner for a given number of input/output waveguides. A sector angle of 60 degrees thus provides a balance of combiner length and electrical performance, depending on the number of input/output waveguides that are being combined. That being said, the subtended angle could be anywhere from a very small angle approaching 0 degrees to an angle approaching 180 degrees.

Side walls 34, 36 extend from output/input waveguide 14 along respective radial lines 26, 28 to arc 30. Opposite face plates 38, 40 extend parallel to the plane of sector 18 between side walls 34, 36, with side walls 34, 36 and face plates 38, 40 enclosing the input/output waveguides 12, output/input waveguide 14, and transition waveguide 16.

In this example, input/output waveguides 12 extend along respective radial lines, such as radial line 42, extending from center 24. All of the input/output waveguides are of equal dimensions providing equal phase and amplitude of signals guided by the input/output waveguides. As shown particularly in FIG. 2, each input/output waveguide 12 has a height H in the E-plane that is transverse to the length of the input/output waveguide. Height H varies along the lengths of the input/output waveguides between inner nodes 44 and outer nodes 32. Inner nodes 44 are aligned in an arc having a radius R1 and outer nodes 32 along arc 30 are located at a radius R2 from center 24. The length of the tapered waveguides is thus the difference between radii R1 and R2. Specifically, waveguide height H increases linearly from inner node 44 to outer node 32. It will be appreciated that beyond inner nodes 44 and outer nodes 32, input/output waveguides 12 could extend further and have other configurations. For example, there could be a section 46 of combiner/divider 10 that extends beyond arc 30 in which the heights of the input/output waveguides are constant, as illustrated by a fragmentary portion shown in dashed lines.

In combiner/divider 10, input/output waveguides 12 typically vary continuously linearly between inner nodes 44 and outer nodes 32, but may also vary in a nonlinear fashion, such as exponentially. The input/output waveguides may have wall faces defining the waveguides, such as faces 48 of transverse walls 50 that are transverse to the plane of sector 18 and extend along radial lines, such as radial line 52, along the lengths of the input/output waveguides between inner nodes 44 and outer nodes 32. As mentioned, the heights of the input/output waveguides can vary linearly or nonlinearly along their lengths. As a result, the thicknesses T of the walls separating the input/output waveguides also increases linearly from inner nodes 44 to outer nodes 32. Generally, the wall thicknesses will be the result of a desired design in the configurations of the input/output waveguides. As will be seen with the combiner/divider illustrated in FIGS. 5-9, waveguide walls of constant thickness increase the amount of taper available for the waveguides for a given sector angle, which results in a more compact structure size.

Referring to FIG. 3, details of the inner nodes or ports 44 of input/output waveguides 12, output/input waveguide 14, and transition waveguide 16 are shown. An inner port 56 of output/input waveguide 14 contacts side walls 34, 36 of transition waveguide 16. Transition waveguide 16 has a cavity 58 extending between inner port 56 of output/input waveguide 14 and inner nodes 44 of input/output waveguides 12. The transition waveguide flares outwardly in the E-plane from the inner port of the output/input waveguide toward the inner nodes of the input/output waveguides and communicatively couples the output/input waveguide with the plurality of input/output waveguides. It is seen that the heights H of input/output waveguides 12 at the inner nodes are very small compared to the heights H at the outer nodes 32. Similarly, the tapered walls vary from a small value of thickness T at the inner nodes compared to the thickness T at the outer nodes.

Figure 4A:
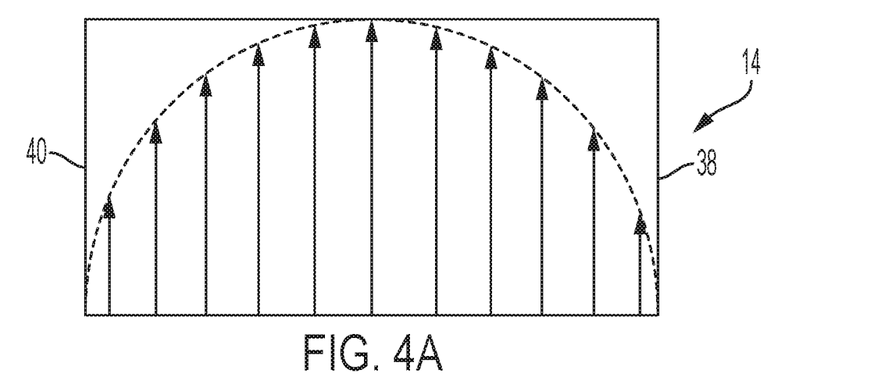
FIG. 4A is a diagram illustrating electric (E)-field magnitude distribution in a cross-section of the output/input waveguide of the combiner/divider of FIGS. 1-3.
Figure 4B:
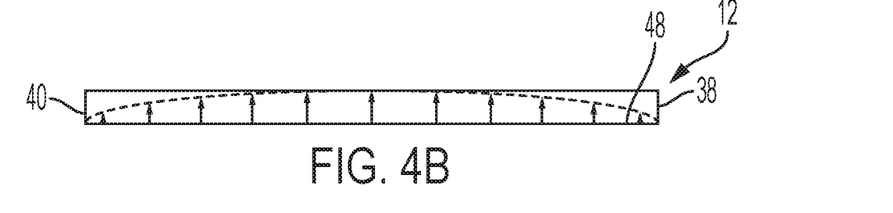
FIG. 4B is a diagram illustrating E-field magnitude distribution in a representative cross-section of the inner end of an input/output waveguide of the combiner/divider of FIGS. 1-3.
Figure 4C:
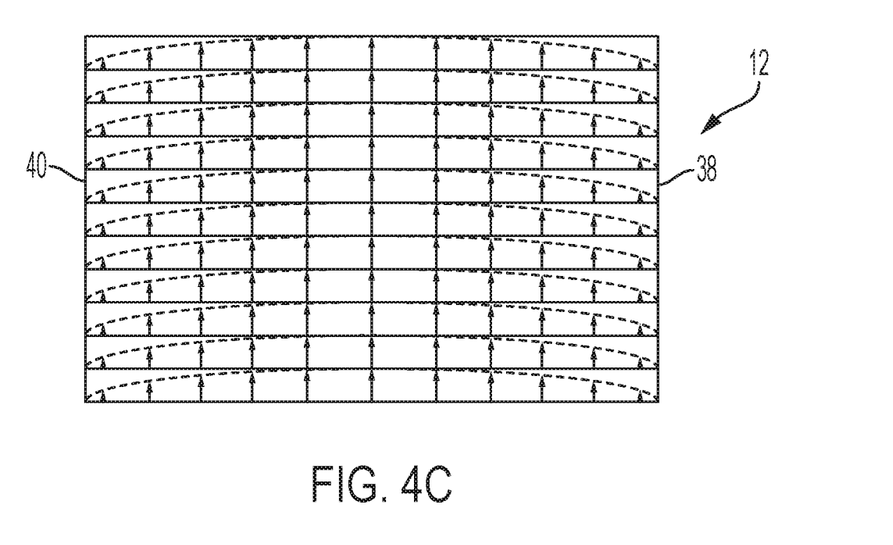
FIG. 4C is a diagram illustrating E-field magnitude distribution in representative cross-sections of the inner ends of stacked input/output waveguides of the combiner/divider of FIGS. 1-3 illustrating that the summation of the E-field distributions of the individual stacked input/output waveguides corresponds to the E-field distribution in the output/input waveguide as shown in FIG. 4A.

FIG. 4A is a diagram illustrating idealized E-field magnitude distribution in a cross-section of the output/input waveguide 14 of combiner/divider 10 of FIGS. 1-3. FIG. 4B is a diagram illustrating idealized E-field magnitude distribution in a representative cross-section of the inner end 44 of an individual input/output waveguide 12 of combiner/divider 10. FIG. 4C, then, is a diagram illustrating a combination of E-field magnitude distributions distributed across representative cross-sections of inner ends 44 of a reduced number (to facilitate illustration) of stacked input/output waveguides 12 of combiner/divider 10 of FIGS. 1-3. FIG. 4C thus illustrates that the summation of the E-field distributions of the stacked input/output waveguides corresponds to the E-field distribution in the output/input waveguide as shown in FIG. 4A.

Radius R1 of cavity 58 may be selected based on size and performance considerations appropriate for a particular application. As FIGS. 4A-4C illustrate, an objective of the combiner/divider is for the multiplicity of the electrical fields that arrive at cavity 58 from input/output waveguides 12 near output/input waveguide 14 (when operating as a combiner) to add up in space as they travel toward the output/input waveguide such that the composite addition of these input electric fields matches the fundamental TE10 mode of the output/input waveguide.

A conceptually minimum value of radius R1, such as radius R1' shown in dashed lines in FIG. 3, is a value chosen such that the arc defined by radius R1 intersects the end of output/input waveguide 14 at inner port 56, which is where the angled side walls 34, 36 of the ends of uppermost and bottommost truncated tapered input/output waveguides 12 reach this point. This results in radius R1 being less than a half of a wavelength of a center design frequency. However, if this was done, the heights H of truncated input/output waveguides 12 at inner nodes 44 would be extremely small and typically would be impractical to manufacture as would the tapered waveguide walls 32, which would become extremely thin at the inner ends proximate cavity 58.

Even if the frequency was low enough such that the truncated ends of the input/output waveguides at inner nodes 44 could be manufactured to reach the location of radius R1', where the uppermost and bottommost truncated tapered input waveguides reach the end of the output/input waveguide at inner port 56, the input waveguide wall thickness would have to be tapered to near zero thickness, i.e. a razor sharp end at that point. Furthermore, the open ends of the input/output waveguides (i.e. their apertures) would act like an array of slot antennas as would the internal sides of the output/input waveguide. When antennas are moved close enough to be in each other's near fields, there would be interactions in the form of reflections back and forth between the array of input/output waveguide slots and the internal aperture of the output/input waveguide. Although these interactions can be compensated for by cancelling reflections from an impedance matching structure (like ribs in the output/input waveguide), it is generally more practical to keep a slightly greater value for R1 to reduce such interactions.

Since very good performance can be achieved with radius R1 significantly larger than this minimal value, such as two to three times greater than the minimum value, it is not necessary to make the manufacturing so onerous for conventional manufacturing processes.

The previous statement applies when considering the voltage standing-wave ratio (VSWR), amplitude, and phase balance of combiner/divider 10. A much more complex performance aspect is the effect on performance if one of the input amplifiers fails and also if a "hot-swap" feature is required, i.e. the failure-mode performance. "Hot-Swap" means that when an input amplifier fails, it can be removed and replaced while all the other amplifiers remain operational. To determine the VSWR under the conditions of an amplifier failing and also when it is removed for "Hot-Swap", requires the calculation of the (N+1)×(N+1)S-matrix (scattering matrix) for a combiner with N input ports. In general, the smaller the value of radius R1, the better the failure mode performance is, but this is extremely difficult to quantify because it depends upon N and radius R1 as well as whether a constant input waveguide wall thickness T is employed (as in combiner/divider 70 of FIGS. 5-9) or a tapered input waveguide wall thickness T is employed (as in combiner/divider 10 of FIGS. 1-3).

Notwithstanding the above, for example, very good performance is achieved for combiner/divider 10 of FIGS. 1-3 with radius R1 approximately equal to 1.2 wavelengths at a center frequency of a design frequency band. If there is not a requirement for failure mode performance, i.e. if it is acceptable for the combiner/divider to operate with good performance when all amplifiers are working. Radius R1 may be much greater than the minimum in such a case, but since a very large radius R1 defines a very large cavity 58, in the event of imbalances in the input amplifiers' signals (either in their amplitude or phase), high order modes are excited in the cavity, resulting in degraded performance. A combiner/divider 10 or 70 having a defined by a radius R1 that is less than 3 wavelengths of the center frequency provides very good performance.

Example 2

Figure 5:
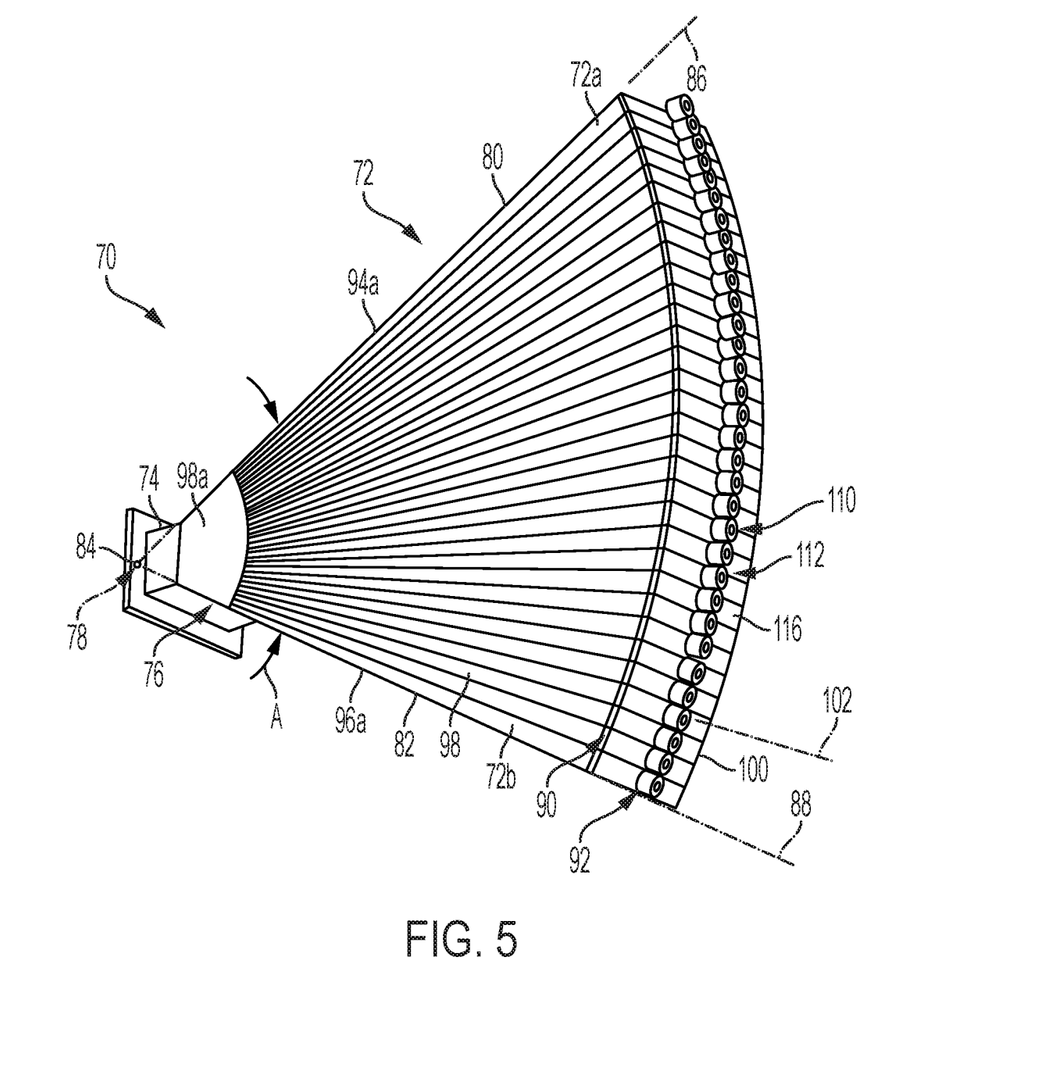
FIG. 5 is an isometric view of an example of a combiner/divider having 32 input/output waveguides stacked in their E-Planes with waveguide walls of constant thickness and integrated coaxial-to-waveguide transitions on the distal ends of the input/output waveguides.
Figure 6:
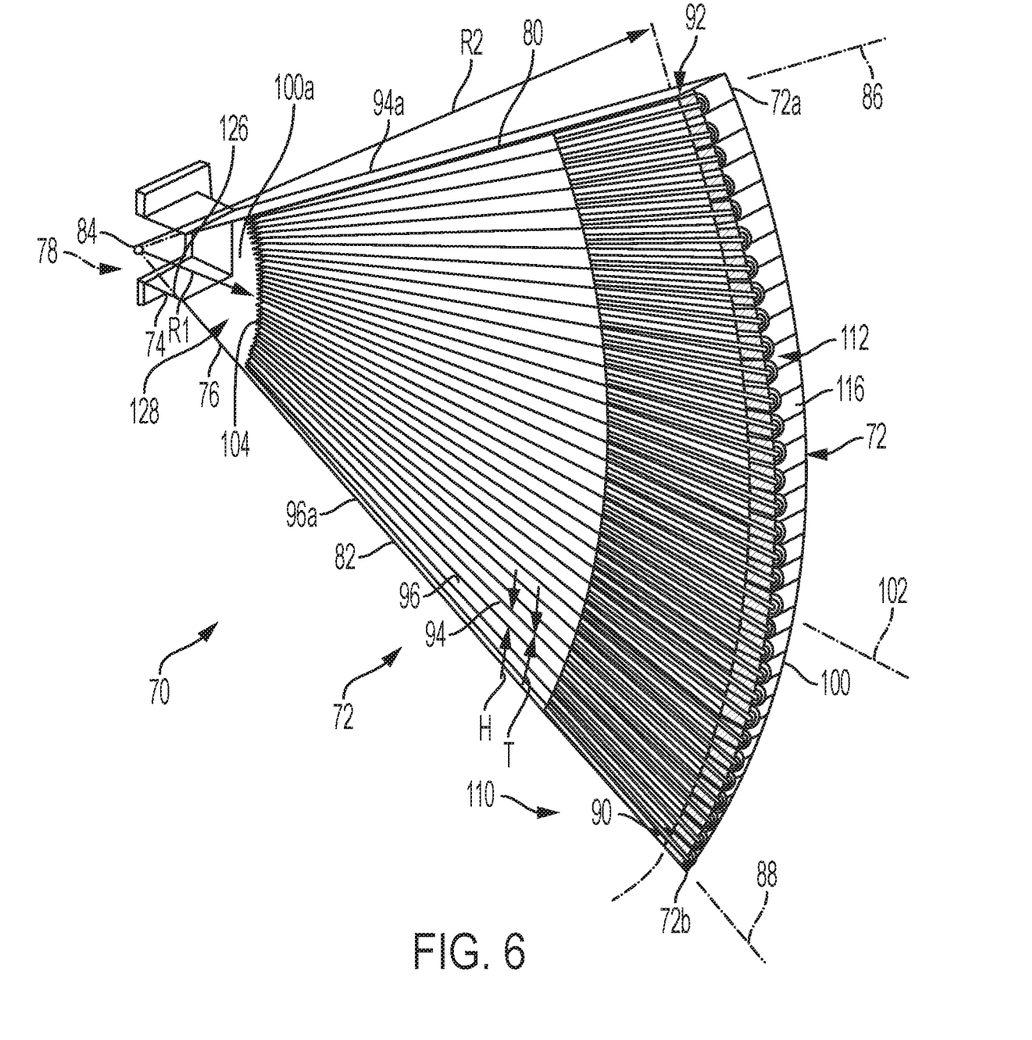
FIG. 6 is an isometric view of a cross section of the combiner/divider of FIG. 5 taken along a plane of the stacked input/output waveguides.
Figure 7:
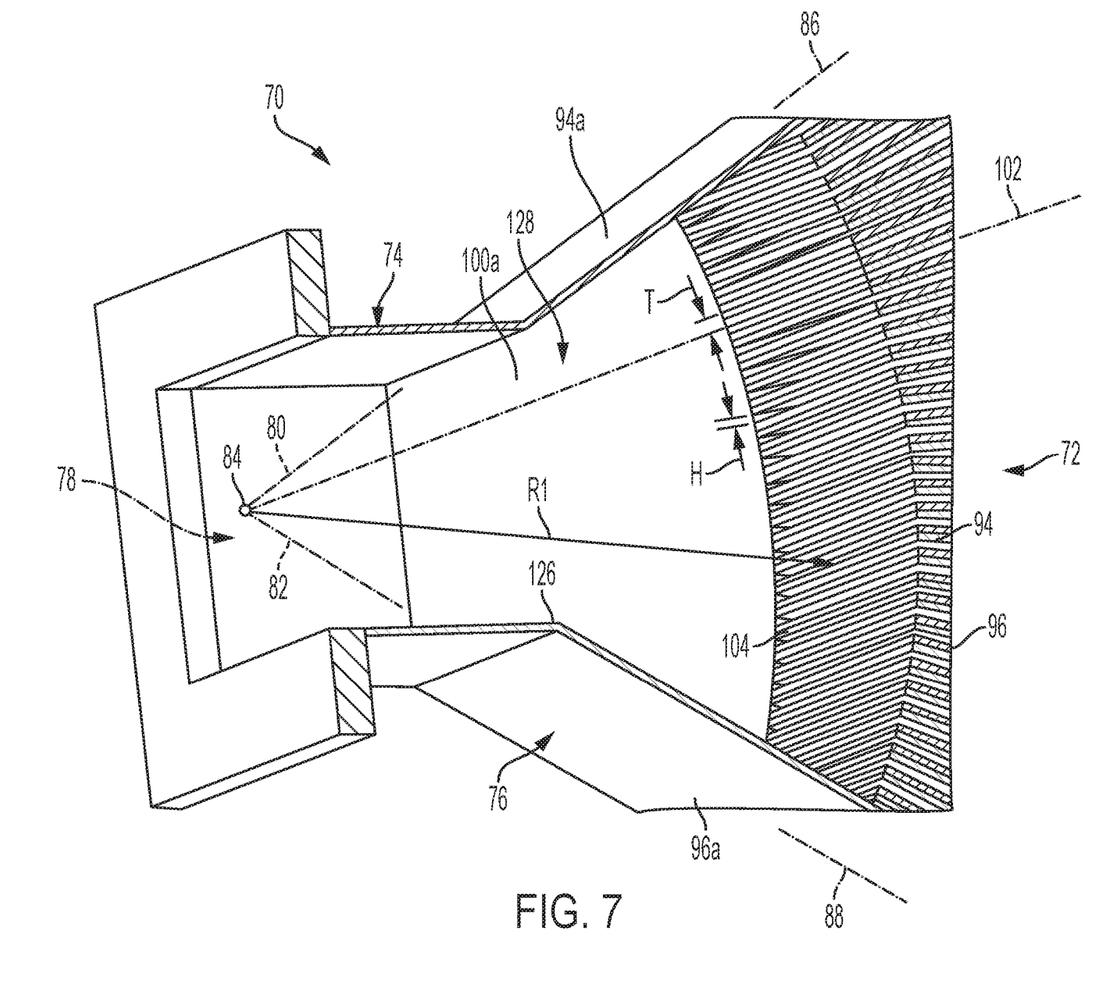
FIG. 7 is an enlarged isometric view of a portion of the combiner/divider in cross section as shown in FIG. 6 showing details of an output/input waveguide, transition waveguide, and inner ends of the input/output waveguides.
Figure 8:
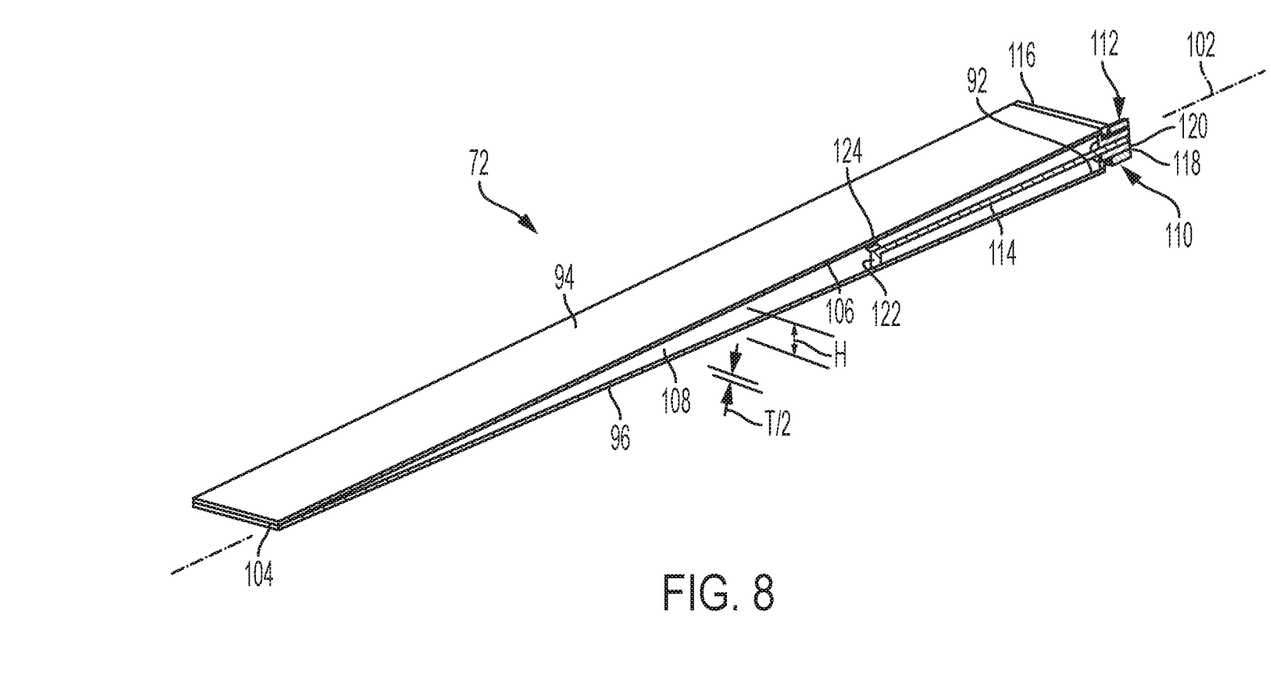
FIG. 8 is an enlarged isometric view in lengthwise cross section of a representative individual input/output waveguide of the combiner/divider of FIG. 5.
Figure 9:
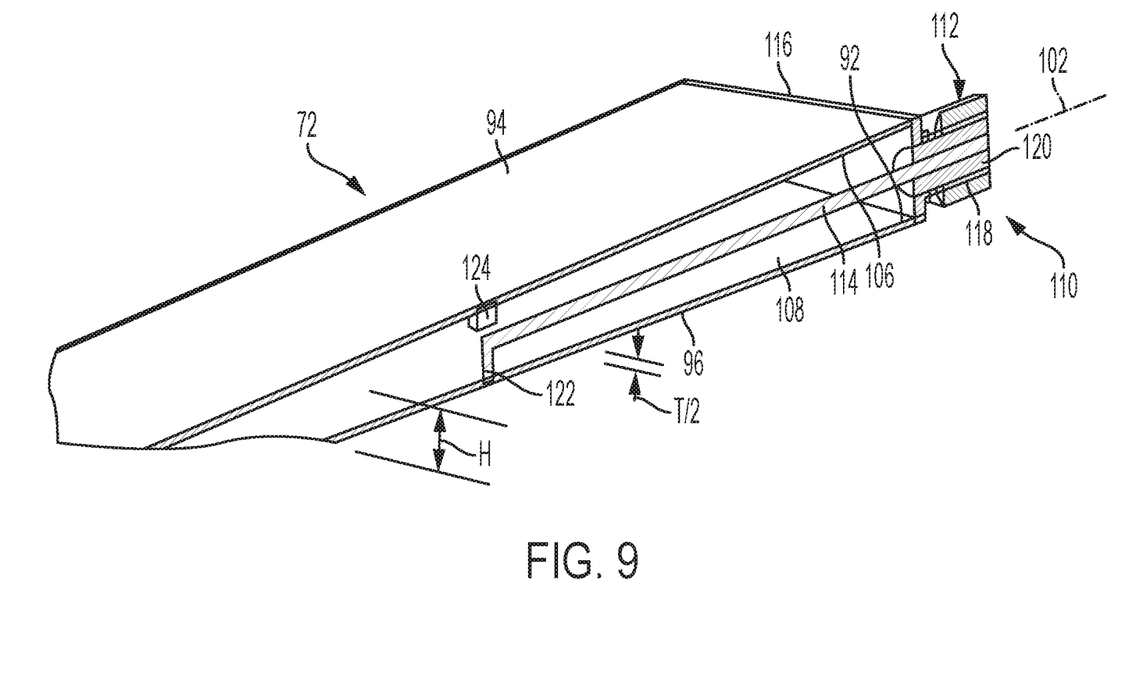
FIG. 9 is a further enlarged image of a portion of the input/output waveguide of FIG. 8 showing the coaxial-to-waveguide transition in more detail.

FIGS. 5-9 illustrate a second embodiment of a combiner/divider that may be designed to operate in the WR975 waveguide frequency band of 0.75-1.15 GHz. FIG. 5 is an isometric view of an example of a combiner/divider 70 having a plurality of 32 input/output waveguides 72 including integrated input/output coaxial-to-waveguide transitions communicatively coupled to an output/input waveguide 74 by a transition waveguide 76. FIG. 6 is an isometric view of a cross section of combiner/divider 70 taken along a plane of stacked input/output waveguides 72 including integrated input/output coaxial-to-waveguide transitions. FIG. 7 is an enlarged isometric view of a portion of combiner/divider 70 in cross section as shown in FIG. 6 showing details of output/input waveguide 74, transition waveguide 76, and truncated inner ends of input/output waveguides 72. FIG. 8 is an enlarged isometric view in lengthwise cross section, as in FIG. 6, of a representative individual input/output waveguide 72 including an integrated input/output coaxial-to-waveguide transition of combiner/divider 70. FIG. 9 is a further enlarged image of a distal portion of the input/output waveguide of FIG. 8 having an integrated coaxial-to-waveguide transition. Combiner/divider 70 is made of electrically conductive material, such as copper, and has other features generally similar to features of combiner/divider 10 discussed above, so comments about the similar features made with reference to combiner/divider 10 also apply to combiner/divider 70.

Input/output waveguides 72 are stacked in their E-Planes as was discussed above for input/output waveguides 12. Input/output waveguides 72 and transitional waveguide 76 are positioned in the configuration of a radial sector 78 defined by outer radii 80, 82, that extend from a center 84 along respective radial lines 86, 88, and an arc 90 extending between the outer radii at outer input/output waveguide nodes 92. In this example, outer nodes 92 are also distal input/output ports of input/output waveguides 72. Input/output waveguides 72 are stacked in sector 78 in a plane corresponding to the plane of sector 78 and the plane of cross section in the view of FIG. 6, which is in the E-planes of the input/output waveguides.

Arc 90 subtends an angle A of 60 degrees, although other angles may be used as appropriate for a given application and number of input/output waveguides. It is preferable that the input/output waveguides extend at least partially in a common direction away from center 84. With combiner/divider 70 each of input/output waveguides 72 extend at least partially to the right as viewed in FIGS. 5 and 6.

Outer side walls 94a, 96a extend from output/input waveguide 74 along respective radial lines 86, 88, and thereby also along respective sector radii 80, 82, to arc 90. Outer side walls 94a, 96a are the outer sides of combiner/divider 70 and also the upper side wall of a top input/output waveguide 72a and a lower side wall of a bottom input/output waveguide 72b, respectively. As shown particularly in FIGS. 8 and 9, each input/output waveguide 72 has an upper side wall 94 and an opposite lower side wall 96, and also has opposite face plates 98, 100 that extend parallel to the plane of sector 78 between respective individual side walls 94, 96. Side walls 94, 96 are seen to be transverse, such as perpendicular, to the plane of sector 78. Side walls 94, 96 and face plates 98, 100 thereby have inner-facing surfaces that form input/output waveguides 72.

Outer side walls 94a, 96a, also are side walls of output/input waveguide 74 and transition waveguide 76. Face plates 98a, 100a extend parallel to the plane of sector 78 between side walls 94a, 96a of output/input waveguide 74 and transition waveguide 76.

In this example, input/output waveguides 72 extend along respective radial lines, such as radial line 102, extending from center 84 within sector 78. All of the input/output waveguides are of equal dimensions providing equal phase and amplitude of signals guided by the input/output waveguides. Each input/output waveguide 72 has a height H in the E-plane that is transverse to the length of the input/output waveguide. Height H varies along the lengths of the input/output waveguides between inner nodes 104 and outer nodes 92. Inner nodes 104 are aligned in an arc having a radius R1 and outer nodes 92 along arc 90 are located at a radius R2 from center 84. The length of each of the tapered waveguides is thus the difference between radii R1 and R2. Specifically, waveguide height H increases linearly from inner node 104 to outer node 92, but could also increase in a nonlinear fashion as appropriate for a particular application. It will be appreciated that beyond inner nodes 104 and outer nodes 92, input/output waveguides 72 could extend further and have other configurations, as mentioned above for combiner/divider 10. For example, there could be a section that extends beyond nodes 92 in which the heights of the input/output waveguides are constant.

The input/output waveguides have wall faces defining the waveguides, such as face 106 of transverse wall 94 and face 108 of transverse wall 96. Faces 106 and 108 are transverse to the plane of sector 78. In combiner/divider 70 the wall thicknesses T/2 are constant over the lengths of the input/output waveguides. Since there are two walls between waveguide-defining wall faces, the total wall thickness between waveguides is T/2+T/2=T. As a result, the heights H of the input/output waveguides increases more than those of combiner/divider 10 for a given length of waveguide for a sector of a given sector angle A. The input/output waveguide walls of constant thickness thus result in increased amounts of waveguide taper per length of for a given sector angle, which correspondingly results in a more compact structure size for combiner/divider 70.

As is particularly shown in FIGS. 8 and 9, integrated end-launch coaxial-to-waveguide transitions 110 are mounted proximate to outer nodes 92 of input/output waveguides 72. Coaxial-to-waveguide transitions 110 transition input/output waveguides 72 to coaxial transmission line connectors 112. The coaxial-to-waveguide transitions include coaxial center conductors 114 that extend from the center of coaxial connector 112 into the centers of input/output waveguides 72. The center conductors extend in tapered input/output waveguides 72 from outer nodes 92 toward inner nodes 104.

Coaxial connectors 112 are mounted in end plates 116 that cover the waveguide ports at nodes 92. The coaxial connectors have outer shield conductors 118 that are connected to end plates 116 and electrically and physically spaced from the center conductors by dielectric insulators 120. The center conductors extend from the coaxial connectors to distal ends that are typically a quarter guide-wavelength of a center design frequency from the coaxial connectors. The distal ends are supported by conductive waveguide probes 122 connecting the distal ends of the center conductors to the bottom walls 96 of the input/output waveguides. In this example, electrically conductive tuning discs 124 are attached to walls 94 opposite probes 122. It will be appreciated that other configurations of coaxial-to-waveguide transitions may also be used for applications where input/output waveguides 72 transition to coaxial transmission lines.

Referring again to FIG. 7, details of the inner nodes or ports 104 of input/output waveguides 72, output/input waveguide 74, and transition waveguide 76 are shown. An inner port 126 of output/input waveguide 74 contacts side walls 94a, 96a of transition waveguide 76. Transition waveguide 76 has a cavity 128 extending between inner port 126 of output/input waveguide 74 and inner nodes 104 of input/output waveguides 72. The transition waveguide flares outwardly in the E-plane from the inner port of the output/input waveguide toward the inner nodes of the input/output waveguides and communicatively couples the output/input waveguide with the plurality of input/output waveguides. It is seen that the heights H of input/output waveguides 72 at the inner nodes are very small compared to the heights H at the outer nodes 92. However, the combination of adjacent walls 94 and 96 between input/output waveguides are a constant thickness T along the full length of the input/output waveguides between the inner nodes and the outer nodes.

Variations in the combiner/dividers described above may also be realized. The combiner/divider design structure shown in the figures herein employs tapered input waveguides such that their heights are all equal where they are truncated near the radial sector origin. This yields equal amplitude coupling between each input/output waveguide port and the output/input waveguide when used as a combiner.

There are some power combiner/divider applications where it is desirable to have an unequal amplitude coupling between the output/input waveguide and the plurality of input/output waveguides. For example, if the structure is used as a power divider to provide signals to radiating elements in an array antenna in order to achieve low sidelobes in the radiation pattern of an array antenna it is desirable to provide larger signals to the central array elements and the signals should decrease toward the ends of the array. The signal distribution can be a truncated Gaussian or a Taylor distribution, for example. Hence, if the subject design structure is used as a divider for this application, then the tapered waveguides may be designed to have larger heights for the central ports and decreasing heights for the end or outer ports where they are truncated at the transition waveguide. In such embodiments and depending on the application, some of the input/output waveguides may not be tapered.

A wider frequency band of operation may be realized using single or double-ridged waveguides. The cross sections of the waveguides shown in the figures herein are rectangular. The frequency bandwidth for such waveguides is in a range from just above the cutoff frequency of the lowest order mode ($TE_{10}$) and just below the cutoff frequency of the next higher order mode ($TE_{20}$) mode. This typically provides a bandwidth of approximately 36%. Using single or double ridged waveguide cross sections, as are known in the art, can substantially increase the operating bandwidth.

It will be appreciated that the sector angle and rate of waveguide taper per length of input/output waveguide may be varied from those shown. As the heights of the waveguides taper from the outer nodes toward the inner nodes, the waveguide impedances decrease linearly as a function of distance from the outer nodes in the examples shown. Rates of taper other than linear have differing performance characteristics. As such, the longer they are the more gradual the impedance taper is and the better the VSWR is. For example, input/output waveguides 72 shown in FIGS. 1-3 may be made half height WR159 to keep the size of the combiner smaller. If full height input/output waveguides are employed, then the combiner/divider would be approximately twice the length and width. The length of the waveguide may thus be selected so that the taper is sufficiently gradual that very good VSWR performance is achieved.

The embodiments shown have single sectors for both the transition waveguide and the input/output waveguides. In some examples, different sector angles may be used. Additionally, the input/output waveguides may extend along different sectors along their lengths. In general, then, other sector configurations may also be realized. However, if the requirement is to add all inputs with equal amplitude and phase weights as is specified for most combiner designs, then sector segments with different subtended angles would cause the input signals to be combined with unequal weights, which is usually undesirable.

There are some requirements for unequal amplitude weights combining or dividing as discussed above. Separate sectors with different subtended angles may be useful if it is required that groups of inputs should have different amplitude weights, but this typically is a rare requirement and the design can compensate for phase weight variations.

Additional Examples

This section describes additional aspects and features of a combiner/divider, presented without limitation as a series of paragraphs, some or all of which may be alphanumerically designated for clarity and efficiency. Each of these paragraphs can be combined with one or more other paragraphs, and/or with disclosure from the description above in any suitable manner. Some of the paragraphs below expressly refer to and further limit other paragraphs, providing without limitation examples of some of the suitable combinations.

A1. A combiner/divider comprising a first plurality of input/output waveguides distributed in a plane, such as in the E-Planes of the input/output waveguides, and diverging in at least a partially common direction away from a central point, wherein each input/output waveguide extends between an outer node disposed distal of the central point and an inner node proximate to and spaced from the central point, and each of at least a second plurality of the first plurality of the input/output waveguides has a respective dimension in the plane that varies along a length of the input/output waveguides between the inner node and the outer node; an output/input waveguide having an inner port proximate to the central point and facing the inner nodes of the plurality of input/output waveguides; and a transition waveguide defining an open cavity between the inner port of the output/input waveguide and the inner nodes of the first plurality of input/output waveguides, wherein the transition waveguide flares outwardly in the plane from the inner port toward the inner nodes and communicatively couples the output/input waveguide with the first plurality of input/output waveguides.

A2. The combiner/divider of paragraph A1, wherein each of the second plurality of the input/output waveguides has a respective dimension in the plane that varies linearly or nonlinearly between the inner node and the outer node.

A3. The combiner/divider of paragraph A1, wherein each of the second plurality of the input/output waveguides has a respective dimension in the plane that increases linearly or nonlinearly between the inner node and the outer node.

A4. The combiner/divider of paragraph A1 or A3, wherein the second plurality of the input/output waveguides equals the first plurality of the input/output waveguides, and the dimensions of the first plurality of input/output waveguides in the plane vary uniformly or nonuniformly between the inner nodes and the outer nodes.

A5. The combiner/divider of paragraph A3, wherein the first plurality of input/output waveguides extend radially along radii from a center of a sector extending in the plane and having a center at the central point, and the outer nodes are disposed along an arc of the sector.

A6. The combiner/divider of paragraph A5, wherein the first plurality of input/output waveguides have side walls that extend along radii from the center.

A7. The combiner/divider of paragraph A5, wherein the transition waveguide has side walls that extend along outer radii of the sector with the outer radii extending from the center along spaced-apart radial sides of the sector.

A8. The combiner/divider of paragraph A7, wherein the first plurality of input/output waveguides are disposed between the outer radii.

A9. The combiner/divider of paragraph A3, wherein the first plurality of input/output waveguides have distal portions extending from the outer nodes away from the inner nodes, the waveguide dimensions being constant along a length of the distal portions.

A10. The combiner/divider of paragraph A3, wherein the first plurality of waveguides have walls defining the waveguides including transverse walls that are transverse to the plane, and adjacent transverse walls of adjacent input-output waveguides of the second plurality of input/output waveguides have respective wall faces that are separated by a distance that increases linearly or nonlinearly between the inner node and the outer node.

A11. The combiner/divider of paragraph A3, further comprising coaxial-to-waveguide transitions mounted proximate to the outer nodes transitioning the input/output waveguides to coaxial transmission lines, the coaxial-to-waveguide transitions including a coaxial center conductor extending into the waveguides from the outer nodes toward the inner nodes.

A12. The combiner/divider of paragraph A1, further comprising coaxial-to-waveguide transitions mounted proximate to the outer nodes, the coaxial-to-waveguide transitions including coaxial center conductors extending into the waveguides from the outer nodes toward the inner nodes.

B1. A combiner/divider comprising a plurality of input/output waveguides distributed in a sector having outer radii extending at an angle from a center, the sector extending in a plane transverse to each of the plurality of input/output waveguides and parallel to electric field vectors of the plurality of input/output waveguides, i.e., in the E-Planes of the input/output waveguides, between the outer radii, wherein the plurality of input/output waveguides extend radially along radii from a center of the sector, the plurality of input/output waveguides extending from inner nodes disposed proximate to and spaced from the center to outer nodes disposed along an arc of the sector, and each of the plurality of input/output waveguides has a respective dimension in the plane that varies from the inner node to the outer node, the plurality of input/output waveguides have transverse walls that are transverse to the plane, the transverse walls extend from the inner nodes to the outer nodes along radii from the center of the sector, and adjacent transverse walls of adjacent input/output waveguides have respective adjacent waveguide wall faces that are separated by a distance that increases linearly between the inner nodes and the outer nodes; an output/input waveguide having an inner port facing and spaced from the inner nodes of the plurality of input/output waveguides; and a transition waveguide defining an open cavity between the inner port of the output/input waveguide and the inner nodes of the plurality of input/output waveguides, and wherein the transition waveguide has side walls spaced apart in the plane that extend along the outer radii of the sector and flare outwardly in the plane from the inner port of the output/input waveguide to the inner nodes of the plurality of input/output waveguides, the transition waveguide communicatively couples the inner port of the output/input waveguide with the inner nodes of the plurality of input/output waveguides.

B2. The combiner/divider of paragraph B1, wherein each of the second plurality of the input/output waveguides has a respective dimension in the plane that varies linearly or nonlinearly between the inner node and the outer node.

B3. The combiner/divider of paragraph B1, wherein each of the second plurality of the input/output waveguides has a respective dimension in the plane that increases linearly or nonlinearly between the inner node and the outer node.

B4. The combiner/divider of paragraph B1, wherein the dimensions of the plurality of input/output waveguides in the plane vary uniformly or nonuniformly between the inner nodes and the outer nodes.

B5. The combiner/divider of paragraph B1, wherein the inner nodes of the input/output waveguides are disposed less than three wavelengths from the sector center.

B6. The combiner/divider of paragraph B5, wherein the inner nodes of the input/output waveguides are disposed more than one half wavelength from the sector center.

Advantages, Features, Benefits

The different embodiments of the combiner/divider described herein provide several advantages over known solutions for dividing or combining high power RF frequency signals. For example, the illustrative embodiments of combiner/dividers described herein allow high power signals to be combined or divided at low loss. As a combiner it is configured to efficiently combine a plurality of input signals directly to an input port of an output waveguide. The resultant power combiner's output power level capability can approach that of the output waveguide. However, not all embodiments described herein provide the same advantages or the same degree of advantage. Variations of these embodiments may also have different advantages or different degrees of advantage.

The disclosed embodiments do not require a coaxial transmission line divider or combiner section at the input/output port which exhibit substantially lower peak and average power handling and thus provides high output power capability. Such a design employs waveguide input ports and a structure that efficiently combines all the input signals directly to a waveguide output/input port with no intermediate coaxial transmission line necessary. This is in contrast to radial waveguide power combiner/dividers which include coaxial output/input sections which limit their power handling capability. A plurality of input/output waveguides are stacked in their E-Planes within a radial sector and taper in height moving from their input/output ports at the outer nodes toward the output/input waveguide where the signals from all the input/output waveguides are added to produce extremely high output power when used as a combiner. Furthermore, since the structure is reciprocal, it may be operated in reverse as a power divider wherein the input/output waveguides function as output waveguides and the output/input waveguide functions as an input waveguide.

Another advantage of the disclosed embodiments is that the number of input ports, N, when used as a combiner or output ports, N, when used as a divider, does not have to be a power of 2, i.e. N does not need to be a binary number, it may be any positive integer greater than or equal to 2. This is an advantage when the subject invention is compared to any so-called corporate network arrangements consisting of a multiplicity of 2-way combiners/dividers (typically Magic-Ts) with N inputs/outputs for which N would necessarily be constrained to be a binary number. This binary-number constraint clearly limits system design flexibility.

CONCLUSION

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and sub-combinations of the various elements, features, functions, and/or properties disclosed herein. The following claims particularly point out certain combinations and sub-combinations regarded as novel and nonobvious. Invention(s) embodied in other combinations and sub-combinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

Where "a" or "a first" element or the equivalent thereof is recited, such usage includes one or more such elements, neither requiring nor excluding two or more such elements. Further, ordinal indicators, such as first, second, or third, for identified elements are used to distinguish between the elements in the order in which they are introduced, and do not indicate a required or limited number of such elements, and do not indicate a particular position or order of such elements unless otherwise specifically indicated. Accordingly, the ordinal indicator used for a particular element may vary in different contexts.

The invention claimed is:

1. A combiner/divider comprising:
a first plurality of input/output waveguides distributed in a plane and diverging in at least a partially common direction away from a central point, wherein each input/output waveguide extends between an outer node disposed distal of the central point and an inner node proximate to and spaced from the central point, and each of at least a second plurality of the first plurality of the input/output waveguides has a respective dimension in the plane that increases linearly (or nonlinearly) between the inner node and the outer node;
an output/input waveguide having an inner port proximate to the central point and facing the inner nodes of the plurality of input/output waveguides; and
a transition waveguide defining an open cavity between the inner port of the output/input waveguide and the inner nodes of the first plurality of input/output waveguides, wherein the transition waveguide flares outwardly in the plane from the inner port toward the inner nodes and communicatively couples the output/input waveguide with the first plurality of input/output waveguides.

2. The combiner/divider of claim 1, wherein the second plurality of the input/output waveguides equals the first plurality of the input/output waveguides, and the dimensions of the first plurality of input/output waveguides in the plane vary uniformly (or nonuniformly) between the inner nodes and the outer nodes.

3. The combiner/divider of claim 1, wherein the first plurality of input/output waveguides extend radially along radii from a center of a sector extending in the plane and having a center at the central point, and the outer nodes are disposed along an arc of the sector.

4. The combiner/divider of claim 3, wherein the first plurality of input/output waveguides have side walls that extend along radii from the center.

5. The combiner/divider of claim 3, wherein the transition waveguide has side walls that extend along outer radii of the sector with the outer radii extending from the center along spaced-apart radial sides of the sector.

6. The combiner/divider of claim 5, wherein the first plurality of input/output waveguides are disposed between the outer radii.

7. The combiner/divider of claim 1, wherein the first plurality of input/output waveguides have distal portions extending from the outer nodes away from the inner nodes, the waveguide dimensions being constant along a length of the distal portions.

8. The combiner/divider of claim 1, wherein the first plurality of waveguides have walls defining the waveguides including transverse walls that are transverse to the plane, and adjacent transverse walls of adjacent input-output waveguides of the second plurality of input/output waveguides have respective wall faces that are separated by a distance that increases linearly (or nonlinearly) between the inner node and the outer node.

9. The combiner/divider of claim 1, further comprising coaxial-to-waveguide transitions mounted proximate to the outer nodes transitioning the input/output waveguides to coaxial transmission lines, the coaxial-to-waveguide transitions including a coaxial center conductor extending into the waveguides from the outer nodes toward the inner nodes.

10. A combiner/divider comprising:
a first plurality of input/output waveguides distributed in a plane and diverging in at least a partially common direction away from a central point, wherein each input/output waveguide extends between an outer node disposed distal of the central point and an inner node proximate to and spaced from the central point, and each of at least a second plurality of the first plurality of the input/output waveguides has a respective dimension in the plane that varies along a length of the input/output waveguides between the inner node and the outer node;
an output/input waveguide having an inner port proximate to the central point and facing the inner nodes of the plurality of input/output waveguides;
a transition waveguide defining an open cavity between the inner port of the output/input waveguide and the inner nodes of the first plurality of input/output waveguides, wherein the transition waveguide flares outwardly in the plane from the inner port toward the inner nodes and communicatively couples the output/input waveguide with the first plurality of input/output waveguides; and
coaxial-to-waveguide transitions mounted proximate to the outer nodes, the coaxial-to-waveguide transitions including coaxial center conductors extending into the waveguides from the outer nodes toward the inner nodes.

11. A combiner/divider comprising:
a plurality of input/output waveguides distributed in a sector having outer radii extending at an angle from a center, the sector extending in a plane transverse to each of the plurality of input/output waveguides and parallel to electric field vectors of the plurality of input/output waveguides, wherein the plurality of input/output waveguides extend radially along radii extending in the sector from the center, the plurality of input/output waveguides extend from inner nodes disposed proximate to and spaced from the center to outer nodes disposed along an arc of the sector, each of the plurality of input/output waveguides has a respective dimension in the plane that increases linearly (or nonlinearly) from the inner node to the outer node, the plurality of waveguides have transverse walls that are transverse to the plane, the transverse walls extend from the inner nodes to the outer nodes along radii from the center of the sector, and adjacent transverse walls of adjacent input/output waveguides have respective adjacent waveguide wall faces that are separated by a distance that increases linearly (or nonlinearly) between the inner nodes and the outer nodes;

an output/input waveguide having an inner port facing and spaced from the inner nodes of the plurality of input/output waveguides; and a transition waveguide defining an open cavity between the inner port of the output/input waveguide and the inner nodes of the plurality of input/output waveguides, and wherein the transition waveguide has side walls spaced apart in the plane that extend along the outer radii of the sector and flare outwardly in the plane from the inner port of the output/input waveguide to the inner nodes of the plurality of input/output waveguides, and the transition waveguide communicatively couples the output/input waveguide with the plurality of input/output waveguides.

12. The combiner/divider of claim 11, wherein the inner nodes of the input/output waveguides are disposed less than three wavelengths from the sector center.

13. The combiner/divider of claim 12, wherein the inner nodes of the input/output waveguides are disposed more than one half wavelength from the sector center.

* * * * *